(12) United States Patent
Choo et al.

(10) Patent No.: US 7,965,206 B2
(45) Date of Patent: Jun. 21, 2011

(54) APPARATUS AND METHOD OF LOSSLESS CODING AND DECODING

(75) Inventors: Ki Hyun Choo, Seoul (KR); Konstantin Osipov, St. Petersburg (RU); Boris Kudryashov, St. Petersburg (RU)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 104 days.

(21) Appl. No.: 12/432,811

(22) Filed: Apr. 30, 2009

(65) Prior Publication Data

US 2010/0079312 A1 Apr. 1, 2010

(30) Foreign Application Priority Data

Sep. 29, 2008 (KR) .................... 2008-95356

(51) Int. Cl.
*H03M 7/40* (2006.01)

(52) U.S. Cl. ............ 341/67; 341/51; 341/65; 341/106; 341/107; 382/232; 382/239; 382/244

(58) Field of Classification Search ............ 341/65, 341/67, 106, 107, 51; 382/232, 239, 244
See application file for complete search history.

(56) References Cited

U.S. PATENT DOCUMENTS

| | | | |
|---|---|---|---|
| 5,574,449 A * | 11/1996 | Golin | 341/65 |
| 5,654,702 A * | 8/1997 | Ran | 341/51 |
| 5,774,081 A | 6/1998 | Cheng et al. | |
| 5,991,499 A * | 11/1999 | Yagasaki et al. | 386/253 |
| 6,344,808 B1 | 2/2002 | Taruki et al. | |
| 6,819,271 B2 | 11/2004 | Geiger et al. | |
| 6,987,468 B1 * | 1/2006 | Malvar | 341/59 |
| 7,016,547 B1 * | 3/2006 | Smirnov | 382/245 |
| 7,486,211 B2 * | 2/2009 | Lin et al. | 341/67 |
| 7,605,722 B2 * | 10/2009 | Beack et al. | 341/50 |
| 7,728,739 B2 * | 6/2010 | Stein | 341/51 |
| 7,782,233 B2 * | 8/2010 | Joung et al. | 341/107 |
| 7,800,520 B2 * | 9/2010 | Lin et al. | 341/67 |
| 2003/0137438 A1 * | 7/2003 | Yokose | 341/106 |

FOREIGN PATENT DOCUMENTS

| | | |
|---|---|---|
| JP | 2004258603 | 9/2004 |
| KR | 20070029793 | 3/2007 |
| KR | 20080025399 | 3/2008 |

* cited by examiner

*Primary Examiner* — Linh V Nguyen
(74) *Attorney, Agent, or Firm* — Stanzione & Kim, LLP

(57) ABSTRACT

An apparatus and a method of lossless coding and decoding are provided. The apparatus to perform lossless coding may selectively perform an arithmetic coding scheme or a Huffman coding scheme with respect to a symbol. The apparatus to perform lossless coding may generate a bitstream including a first coding bit, generated according to the Huffman coding scheme. Such bitstream may include a reserved bit for the arithmetic coding scheme.

23 Claims, 10 Drawing Sheets

APPARATUS AND METHOD OF LOSSLESS CODING AND DECODING

CROSS-REFERENCE TO RELATED APPLICATIONS

This application claims priority under 35 U.S.C §119(a) from Korean Patent Application No. 10-2008-0095356, filed on Sep. 29, 2008, in the Korean Intellectual Property Office, the disclosure of which is incorporated herein in its entity by reference.

BACKGROUND

1. Field of the Inventive Concept

The present general inventive concept relates to a method of coding and decoding audio signals, and more particularly, to a method of lossless coding and decoding.

2. Description of the Related Art

Coding refers to converting an audio signal into a digital bitstream, and decoding refers to converting the digital bitstream into the audio signal. The decoding operation may be the opposite of the coding operation.

The coding of the audio signal may include estimating attributes of the audio signal, quantizing the estimated attributes, and lossless coding of the quantized sample or symbol.

The estimating of the attributes of the audio signal may be performed by converting an audio signal in a time domain into a spectrum component in a frequency domain.

During the course of the quantizing of the estimated attribute, a portion of the audio signal information may be lost. As the loss of the audio signal information increases, it may be more difficult to restore an original audio signal via the coding and decoding operations.

To easily perform a signal processing with respect to the quantized sample or symbol, the sample or symbol may be converted into a bitstream. In this instance, an operation of converting information included in the sample or symbol into a bitstream without losses refers to lossless coding, and decoding the sample or symbol without losses from the bitstream refers to lossless decoding.

SUMMARY

The present general inventive concept may provide an apparatus to perform lossless coding capable of selectively performing an arithmetic coding scheme or a first coding scheme with respect to a symbol. The apparatus to perform lossless coding may generate a bitstream including a first coding bit being generated according to the first coding scheme and a reserved bit for the arithmetic scheme, when the first coding scheme is selected.

The apparatus to perform lossless coding may read a first bit of a first length among the bitstream and store the read first bit in a register. The apparatus may sequentially read a second bit after the first bit among the bitstream. The apparatus may selectively perform the arithmetic decoding scheme or the first decoding scheme with respect to the second bit.

Additional embodiments of the present general inventive concept will be set forth in part in the description which follows and, in part, will be obvious from the description, or may be learned by practice of the general inventive concept.

An embodiment of the present general inventive concept may provide a method of lossless coding, including selecting either an arithmetic coding scheme or a first coding scheme with respect to a symbol, and performing the selected coding scheme with respect to the symbol. The performing of the selected coding scheme may generate a bitstream including a first coding bit, generated according to the first coding scheme, and a reserved bit for the arithmetic coding scheme when the first coding scheme is selected.

An embodiment of the present general inventive concept may provide a method of lossless decoding including reading a first bitstream of a first length among bitstream, storing the read first bitstream in a register, reading a second bit after the first bitstream among the bitstream, selecting either the arithmetic coding scheme or the first decoding scheme with respect to the second bit, and generating the symbol by performing the decoding scheme selected with respect to the second bit.

The example embodiments of the present general inventive concept may use both an arithmetic scheme and the Huffman coding scheme without generating additional overhead.

The example embodiments of the present general inventive concept may also enhance efficiency and reduce complexity of operations to perform lossless coding of an audio signal.

BRIEF DESCRIPTION OF THE DRAWINGS

These and/or other embodiments of the present general inventive concept will become apparent and more readily appreciated from the following description of the example embodiments, taken in conjunction with the accompanying drawings of which.

DETAILED DESCRIPTION OF THE EMBODIMENTS

Reference will now be made in detail to example embodiments of the present general inventive concept, examples of which are illustrated in the accompanying drawings, wherein like reference numerals refer to the like elements throughout. The example embodiments are described below in order to explain the present general inventive concept by referring to the figures.

Figure 1:
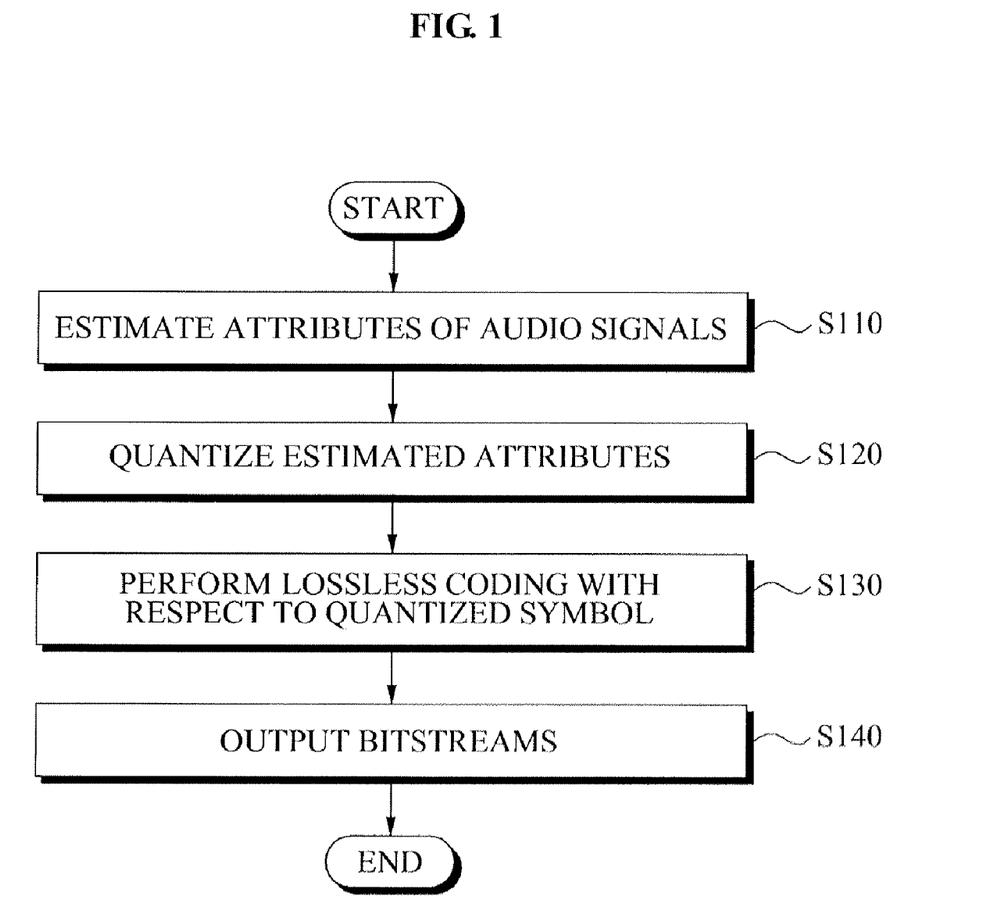
FIG. 1 is a flowchart illustrating operations to code an audio signal according to an example embodiment.

FIG. 1 is a flowchart illustrating operations to code an audio signal according to an example embodiment.

Referring to FIG. 1, the coding of the audio signals may include estimating attributes of audio signals in operation S110. In operation S110, the coding of the audio signals may transform audio signals in a time domain into spectrum components in a frequency domain. For example, the coding of the audio signals may transform the audio signals in the time domain into the spectrum components in the frequency domain via Modified Discrete Cosine Transform (MDCT), or similar transforming techniques.

The coding of the audio signals may quantize estimated frequency components in operation S120. The coding of the audio signals may generate important spectral components (ISC) by selecting a portion of the spectrum components in the frequency domain. However, during the course of the quantization, a portion of the attributes of audio signals may be lost. Therefore, the coding of the audio signals may use a selective algorithm which reduces information loss.

The coding of the audio signals may perform lossless coding with respect to the quantized symbol in operation S130.

The coding of the audio signals may output a bitstream in which lossless coding is performed in operation S140.

Figure 2:
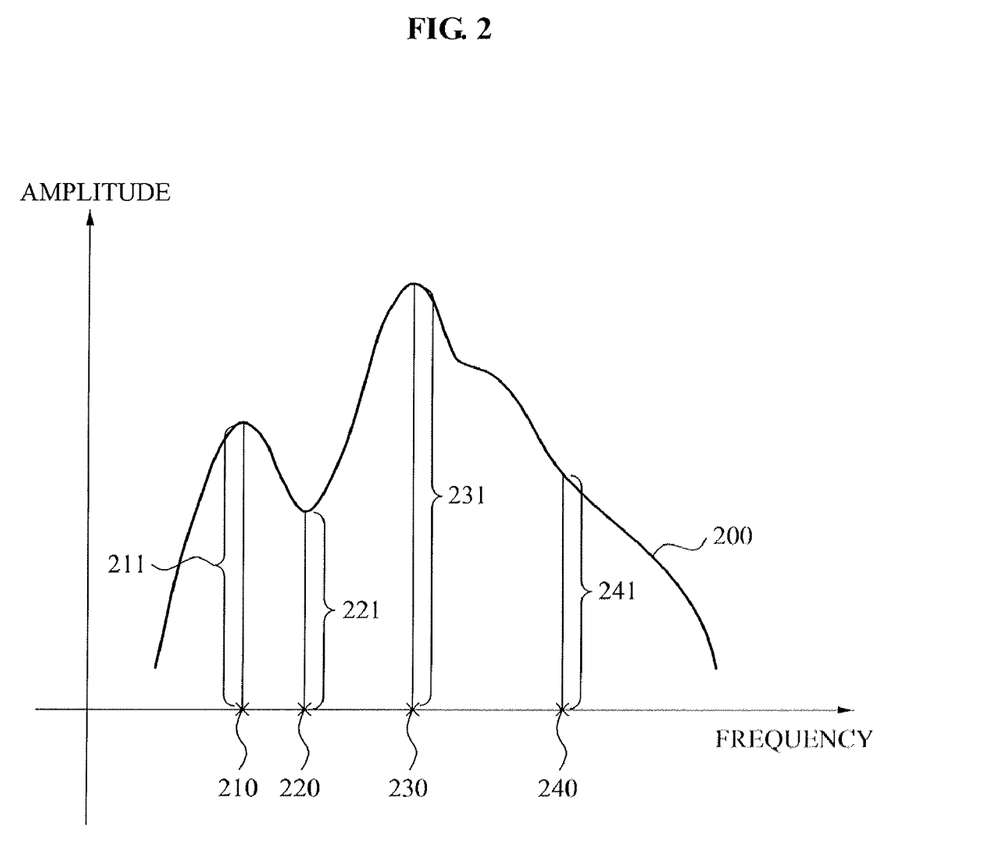
FIG. 2 is a diagram illustrating an operation to quantize estimated attributes of FIG. 1.

FIG. 2 is a diagram illustrating operation S120 of FIG. 1.

FIG. 2 illustrates an audio signal 200 which can be transformed into a frequency domain signal. The coding of the audio signal 200 may include selecting a portion of spectrum components of the audio signal 200. The coding of the audio signal may generate location information 210 of a selected frequency and amplitude 211 corresponding to the location information 210 as a first sample of the ISC to be quantized. Coding of the location information 210 and the amplitude information 211 may be performed after quantization is performed thereon. In the quantization operation, quantization of the location information may be performed without loss, and quantization of the amplitude information may be perceptively performed according to sensitivity based on a Psychoacoustic model. The quantization may include vector quantization, scalar quantization, and the like.

The coding of the audio signal 200 may generate location information 220 and amplitude information 221 corresponding to the location information 220 as a second sample of the ISC. The coding of the audio signal 200 may also generate location information location information 230 and amplitude information 231 corresponding to the location information 230 as a third sample of ISC, and may generate location information 240 and amplitude information 241 corresponding to the location information 240 as a fourth sample of ISC.

In this instance, a distance between the location information 210 and the location information 220 may differ from a distance between the location information 220 and the location information 230.

The coding of the audio signal may generate symbols by binarizing information of the quantized samples. As an example, if scalar quantization is performed, index information in which scalar quantization is performed can be binarized to generate the symbols.

The coding of the audio signals may represent each of the location information as a symbol. The coding of the audio signals may apply lossless coding with respect to the location information symbol.

Figure 8:
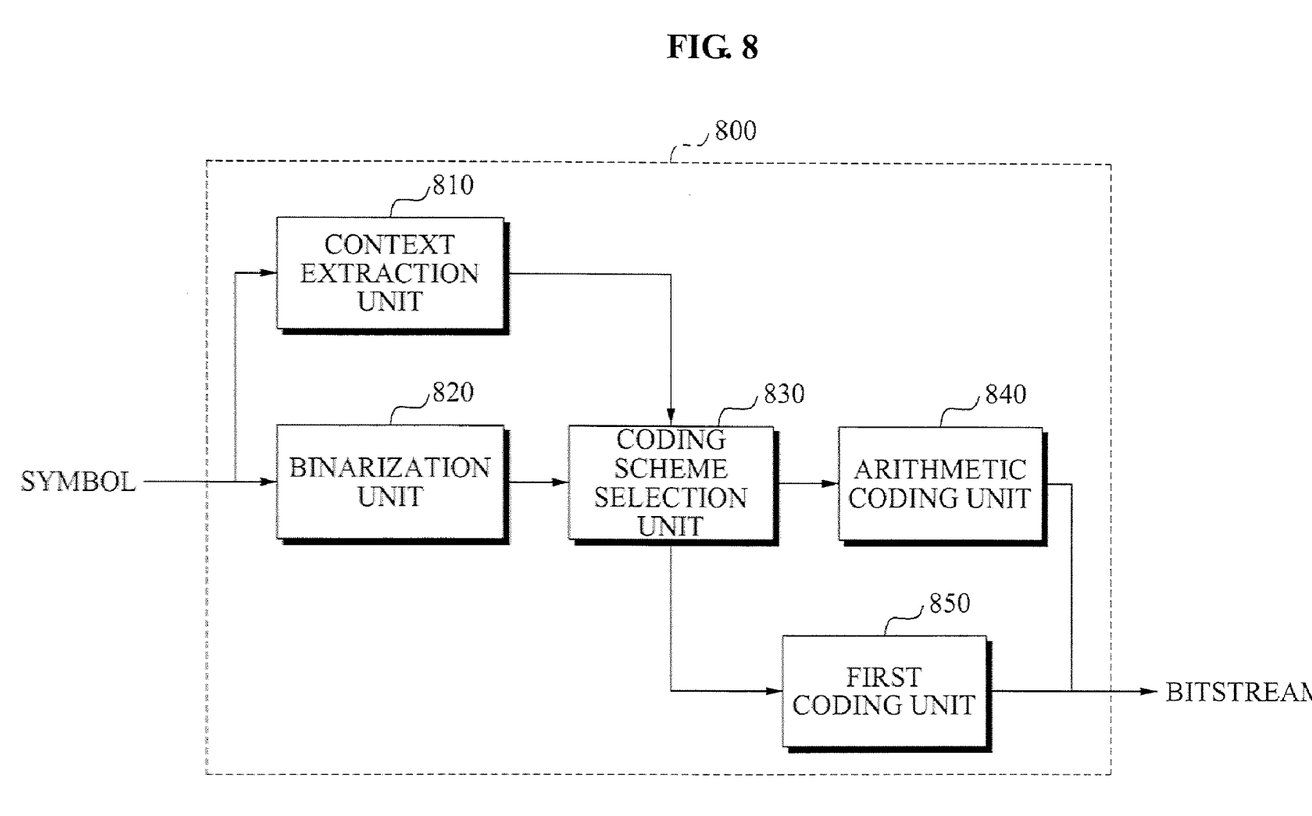
FIG. 8 is a diagram illustrating an apparatus to perform lossless coding according to an example embodiment.

FIG. 8 is a diagram illustrating an apparatus 800 to perform lossless coding according to an example embodiment of the present general inventive concept.

Referring to FIG. 8, the apparatus 800 to perform lossless coding may include a context extraction unit 810, a binarization unit 820, a coding scheme selection unit 830, an arithmetic coding unit 840, and a first coding unit 850.

The context extraction unit 810 may extract a context of a first symbol among sequential symbols. The first symbol may be any one of the sequential symbols.

The context extraction unit 810 may extract the context of the first symbol based on symbol values adjacent to the first symbol or symbol values in a previous frame of the first symbol.

The binarization unit 820 may binarize the first symbol.

The coding scheme selection unit 830 may select a coding scheme to be applied to the binarized first symbol. The coding scheme selection unit 830 may select a coding scheme to be applied to the first symbol based on the context of the first symbol.

The coding scheme selection unit 830 may select either an arithmetic coding scheme or a first coding scheme. In this instance, the first coding scheme may be a coding scheme which maps a single symbol on a single bit or on a plurality of bits, such as the Huffman coding scheme.

When the arithmetic coding scheme is selected with respect to the first symbol, the arithmetic coding unit 840 may perform arithmetic coding with respect to the first symbol. When the arithmetic scheme is selected with respect to the first symbol, the first coding unit 850 may generate a bitstream by applying the first coding scheme to the first symbol.

The apparatus 800 to perform lossless coding may transform the first symbol into a bitstream according to the selected coding scheme, and may generate a sequential bitstream by coding the sequential symbols.

The apparatus 800 to perform lossless coding may generate the bitstream including a first coding bit, generated according to the first coding scheme, when the first coding scheme is selected. Here, the bitstream may further include a reserved bit for an arithmetic scheme in addition to the first coding bit.

Figure 3:
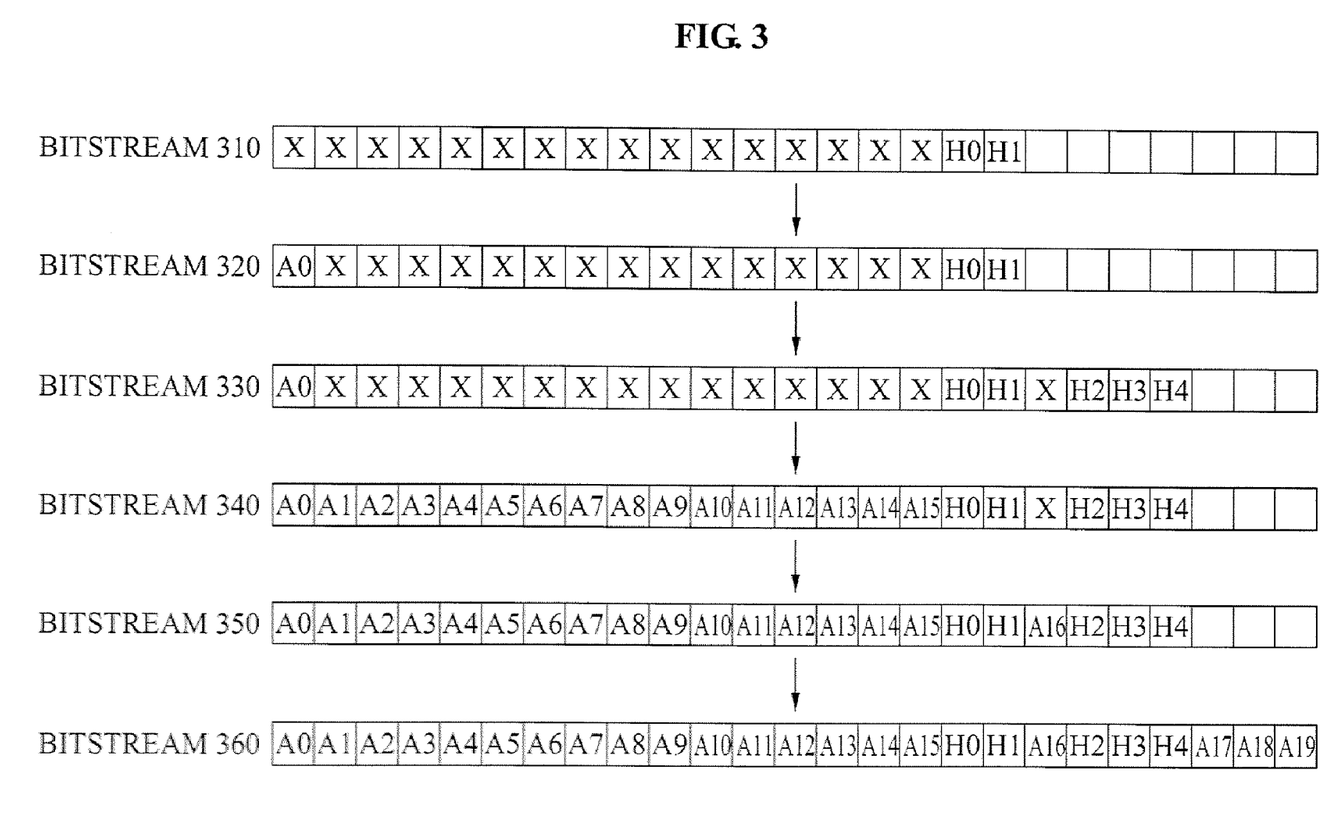
FIG. 3 is a diagram illustrating example operations to perform lossless coding which can be carried out in an apparatus to perform r lossless coding.

FIG. 3 is a diagram illustrating operations to perform lossless coding which can be carried out in the apparatus 800 to perform lossless coding.

Referring to FIG. 3, the apparatus 800 to perform lossless coding of FIG. 8 may generate a bitstream 310 including 16 reserved bits Xs. The reserved bits may relate to an amplitude of a register for an arithmetic coding. When the arithmetic coding scheme is combined with a first coding scheme, at least M number of reserved bits may be used to perform the arithmetic coding scheme without a bitstream jump. M may have a value such as 16, 32, and the like, and may not always be a constant value. Through scale information of the arithmetic coding scheme, at least one reserved bit may additionally be used. When the first coding scheme is applied, an M number of reserved bits may be fixed. For example, as illustrated in FIG. 3, the number of a reserved bits can be fixed to be 16 (M=16). In this case, when a first coding scheme is selected with respect to the first symbol, the apparatus 800 to perform lossless coding may generate the bitstream 310 by sequentially adding bits H0 and H1, generated according to the first coding scheme, to the 16 reserved bits Xs.

When an arithmetic coding scheme is selected with respect to a second symbol after the first symbol, the apparatus 800 to perform lossless coding may generate the bitstream 320 by replacing a first bit among the reserved bits Xs with a bit A0 generated according to the arithmetic coding scheme.

When an arithmetic coding scheme is selected with respect to a third symbol after the second symbol, the apparatus 800 to perform lossless coding may generate the bitstream 330 by adding a reserved bit X to the bitstream 320 and sequentially adding bits H2, H3, and H4 generated according to the first coding scheme to the bitstream 320. Since 15 reserved bits Xs included in the bitstream 320, the apparatus 800 to perform lossless coding may generate the bitstream 330 including 16 reserved bits Xs by adding a single reserved bit X, when the first coding scheme is selected with respect to the third symbol.

When an arithmetic coding scheme is selected with respect to a fourth symbol, and the fourth symbol corresponds to a single symbol or multiple sequential symbols, the apparatus 800 to perform lossless coding may generate a bitstream 340 by sequentially replacing the 15 reserved bits Xs of the bitstream 330 with bits A1 through A15.

When an arithmetic coding scheme is selected with respect to a fifth symbol after the fourth symbol, the apparatus 800 to perform lossless coding may generate the bitstream 350 by replacing a reserved bit X of the bitstream 340 with a bit A16 being generated according the arithmetic coding scheme.

When an arithmetic coding scheme is selected with respect to a sixth symbol after the fifth is selected, and the sixth symbol corresponds to a single symbol or multiple sequential symbols, the apparatus 800 to perform lossless coding may generate a bitstream 360 by sequentially adding bits A17, A18, and A19, generated according the arithmetic coding scheme, to the bitstream 350.

In this way, the apparatus 800 to perform lossless coding may sequentially replace a reserved bit with an arithmetic coding bit, generated according to the arithmetic coding scheme, when an arithmetic coding scheme is selected.

Moreover, when an arithmetic coding scheme is selected, the apparatus 800 to perform lossless coding may sequentially add an arithmetic coding bit to a bitstream when a remaining reserved bit does not exist.

In accordance with example embodiments of the present general inventive concept, the apparatus 800 to perform lossless coding may perform an arithmetic coding scheme using a 16 bit register.

When the first coding scheme is selected, the apparatus 800 to perform lossless coding may continuously perform an arithmetic coding scheme when the arithmetic coding scheme is selected based on reserved bits numbering the same as a number of bits denoting an amplitude of a register in an output bitstream.

The apparatus 800 to perform lossless coding may provide continuity between arithmetic coding operations when sequentially performing an arithmetic coding, a first coding, and an arithmetic coding. Therefore, the apparatus 800 to perform lossless coding may combine and perform the arithmetic coding and the first coding without an additional overhead bit.

The apparatus 800 to perform lossless coding may code amplitude information using a method of combining the arithmetic coding scheme and the first coding scheme. Also, the apparatus 800 to perform lossless coding may sequentially add a bitstream, generated by location information of a bitstream generated based on the amplitude information. In this instance, the apparatus 800 to perform lossless coding may improve efficiency of coding operations by coding the amplitude information using the arithmetic coding scheme. Since the arithmetic coding scheme and the first coding scheme can be combined and performed with respect to the location information, the apparatus 800 to perform lossless coding may replace a reserved bit with an arithmetic coded bit through the arithmetic coding operation with respect to the amplitude information to improve efficiency of the coding operation when many reserved bits are included in the generated bitstream.

Figure 5:
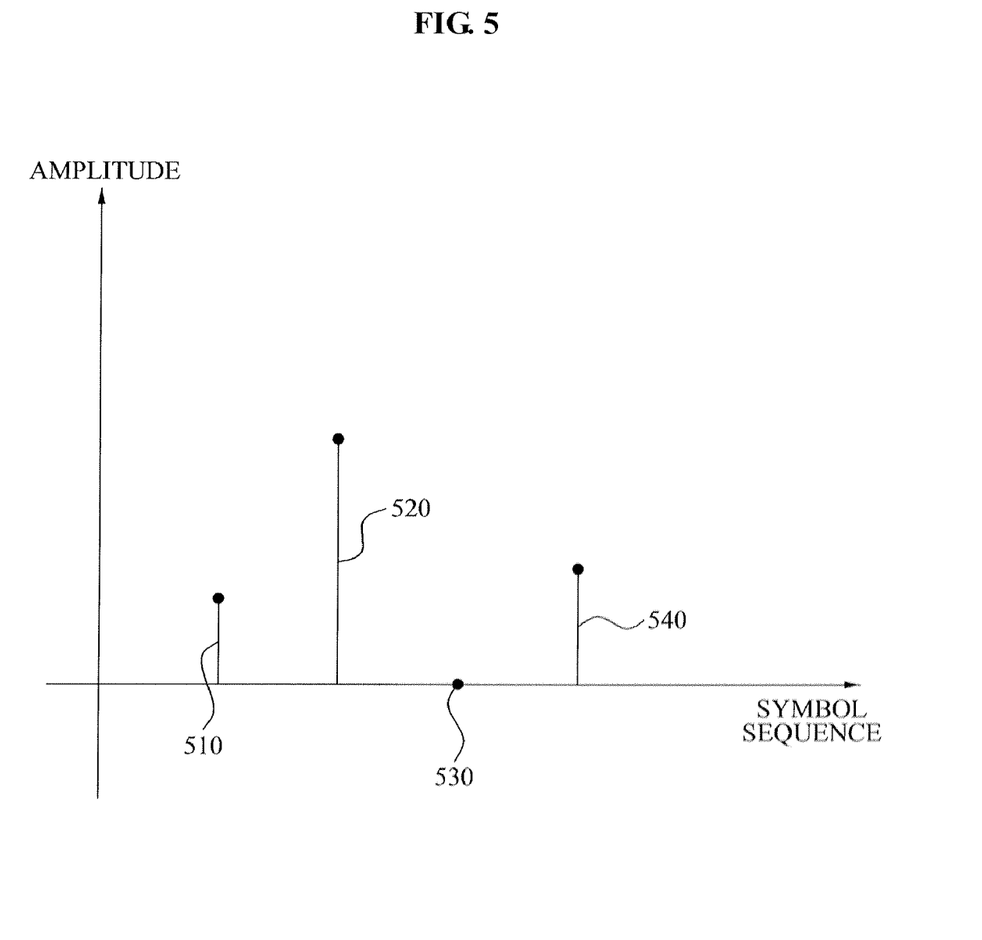
FIG. 5 is a diagram illustrating example operations to select a coding scheme of the apparatus to perform lossless coding.

FIG. 5 is a diagram illustrating example operations to select a coding scheme of the apparatus 800 to perform lossless coding of FIG. 8.

For example, referring to FIG. 5, a first symbol may include first amplitude information 510, and a second symbol may include second amplitude information 520. A third symbol may include third amplitude information 530, and a fourth symbol may include fourth amplitude information 540.

The apparatus 800 to perform lossless coding may select a coding scheme of the second symbol based on the first amplitude information 510 of the first symbol, which is a symbol previous to the second symbol.

The apparatus 800 to perform lossless coding may select a coding scheme of the third symbol based on the second amplitude information 520 of the second symbol, which is a symbol previous to the third symbol.

The apparatus 800 to perform lossless coding may select a coding scheme of the fourth symbol based on the third amplitude information 530 of the third symbol, which is a symbol previous to the fourth symbol. The apparatus 800 to perform lossless coding may select the Huffman coding scheme with respect to the fourth symbol since an amplitude of the third amplitude information 530 is 0.

In another example embodiment illustrated in FIG. 8, when a symbol has a probability distribution corresponding to $(1/2)^N$ (N: positive number), the apparatus 800 to perform lossless coding may select the Huffman coding scheme with respect to the symbol instead of selecting the arithmetic coding scheme.

For example, to calculate a probability distribution with respect to a symbol, it can be assumed that a probability that a symbol is A is 0.9, a probability that a symbol is B is 0.05, and a probability that a symbol is C is 0.05.

Given these probabilities, the apparatus 800 to perform lossless coding may perform the Huffman coding operation using a Huffman codeword {00, 10, 11}. In this case, when the Huffman coding scheme is selected, the apparatus 800 to perform lossless coding may allocate a codeword 00 to the symbol A, allocate a codeword 10 to the symbol B, and allocate a codeword 11 to the symbol C. In this instance, a probability that a codeword generated according to the Huffman coding scheme is 0 is 0.9, and a probability that a codeword is 10 is 0.05, and a probability that a codeword is 11 is 0.05.

In this case, entropy with respect to a probability of a given symbol may be calculated as Equation 1. The entropy may be a theoretical limit of a minimum bit which may be achieved with respect to the given probability.

$$\text{Entropy} = -0.9 \log 2(0.9) - 0.05 \log 2(0.05) - 0.05 \log 2(0.05) = 0.569 \text{ (bit)} \quad \text{[Equation 1]}$$

An average length of the Huffman codeword may be calculated as Equation 2.

$$\text{Huffman codeword length} = 0.9 \times 1 + 0.05 \times 2 + 0.05 \times 2 = 1.1 \text{ (bit)} \quad \text{[Equation 2]}$$

Based on Equations 1 and 2, it can be understood that the Huffman coding can have a longer average bit length by about 0.531 bit compared to the entropy calculation. Thus, it may be determined that efficiency of coding operations is lower when an average bit length is longer.

The probability that the codeword is 0 is 0.9 may be represented as P(0)=0.9.

Since it has been assumed that probabilities that the codeword is 10 or the codeword is 01 are 0.05, a conditional probability that a second level of the codeword is 00 may be represented as P(0/1)=0.5 when a first level of the codeword is 1. Also, a conditional probability that the second level of the codeword may be represented as P(1/1)=0.5 when the first level of the codeword is 1.

Accordingly, since conditional probabilities that the second level of the codeword are ½ and ½, the apparatus 800 to perform lossless coding may apply the arithmetic coding scheme to the first level and apply the Huffman coding scheme to the second level.

The apparatus 800 to perform lossless coding may thus provide lossless coding operations whose efficiency is higher and complexity is lower by using both the Huffman coding (whose efficiency is lower and complexity is lower) and the arithmetic coding (whose efficiency is higher and complexity is higher), to increase overall coding efficiency.

For example, an average length of the codeword of the apparatus 800 to perform lossless coding may be represented by, $$\text{codeword length} = -0.9 \log 2(0.9) - 0.1 \log 2(0.1) + 0.1 \times 1 = 0.569 \text{ (bit)} \quad \text{[Equation 3]}$$

Since the average length of the codeword of the apparatus 800 to perform lossless coding is identical to that of entropy, the apparatus 800 to perform lossless coding may maximize efficiency and reduce complexity by using a combined coding method in comparison to the case of using fully arithmetic coding.

In another embodiment of FIG. 8, the apparatus 800 to perform lossless coding may combine and use the arithmetic coding and the Huffman coding when performing lossless coding of N number of symbols.

In this case, the apparatus 800 to perform lossless coding may binarize a symbol, and may apply different coding schemes to each level of the binarized symbol.

For example, the apparatus 800 to perform lossless coding may apply the arithmetic coding to A and apply the Huffman coding to B, when S={A, B}.

Figure 9:
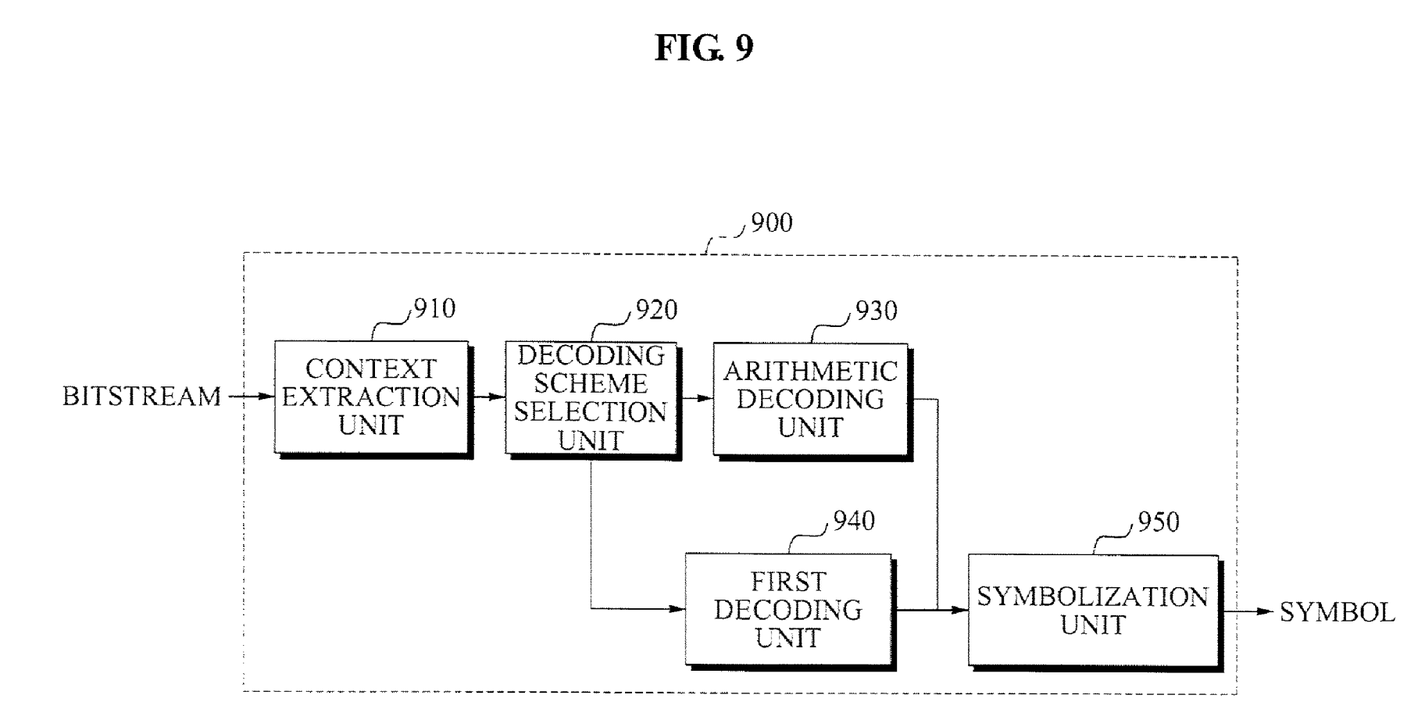
FIG. 9 is a diagram illustrating an apparatus to perform lossless decoding according to an example embodiment.

FIG. 9 is a diagram illustrating an apparatus 900 to perform lossless decoding according to an example embodiment of the present general inventive concept.

Referring to FIG. 9, the apparatus 900 to perform lossless decoding may include a context extraction unit 910, a decoding scheme selection unit 920, a first decoding unit 940, and a symbolization unit 950.

The apparatus 900 to perform lossless decoding may read a first bitstream of a first length among the sequential bitstream and may store the read first bitstream in a register. Here, the first length may correspond to an amplitude of the register.

The apparatus 900 to perform lossless decoding may select a reference bitstream to be decoded from the sequential bitstreams. A length of the reference bitstream may be determined based on an amplitude of a symbol to be generated. As an example, when the symbol is four bits and has 16 values, the reference bitstream may be four bits.

The apparatus 900 to perform lossless decoding may sequentially read a bitstream after the first bitstream. In this instance, the apparatus 900 to perform lossless decoding may select a second bit after the first bit as the reference bit.

The apparatus 900 to perform lossless decoding may generate a symbol by decoding the selected reference bitstream.

The context extraction unit 910 may extract a context of the reference bitstream from symbols which are decoded in advance. For example, the context extraction unit 910 may extract the context of the reference bitstream based on either inter-frame prediction or intra frame prediction, or based on both inter frame prediction and intra-frame prediction.

The decoding scheme selection unit 920 may select either an arithmetic decoding scheme or a first decoding scheme with respect to the reference bitstream based on the context.

The arithmetic decoding unit 930 may perform arithmetic decoding based on the first bitstream and the second bitstream stored in the register when the arithmetic decoding scheme is selected with respect to the reference bitstream.

The first decoding unit 940 may perform first decoding with respect to a second bit when the first decoding scheme is selected with respect to the reference bitstream. The first decoding scheme may be a decoding scheme in which a single symbol is mapped on a single bit or on multiple bits. Alternatively, the first decoding scheme may be the Huffman decoding scheme.

The apparatus 900 to perform lossless decoding may selectively perform the arithmetic decoding scheme or the first decoding scheme with respect to the reference bit.

The symbolization unit 950 may generate a symbol based on the decoding result in the arithmetic decoding unit 930 and the decoding result in the first decoding unit 940.

Figure 4:
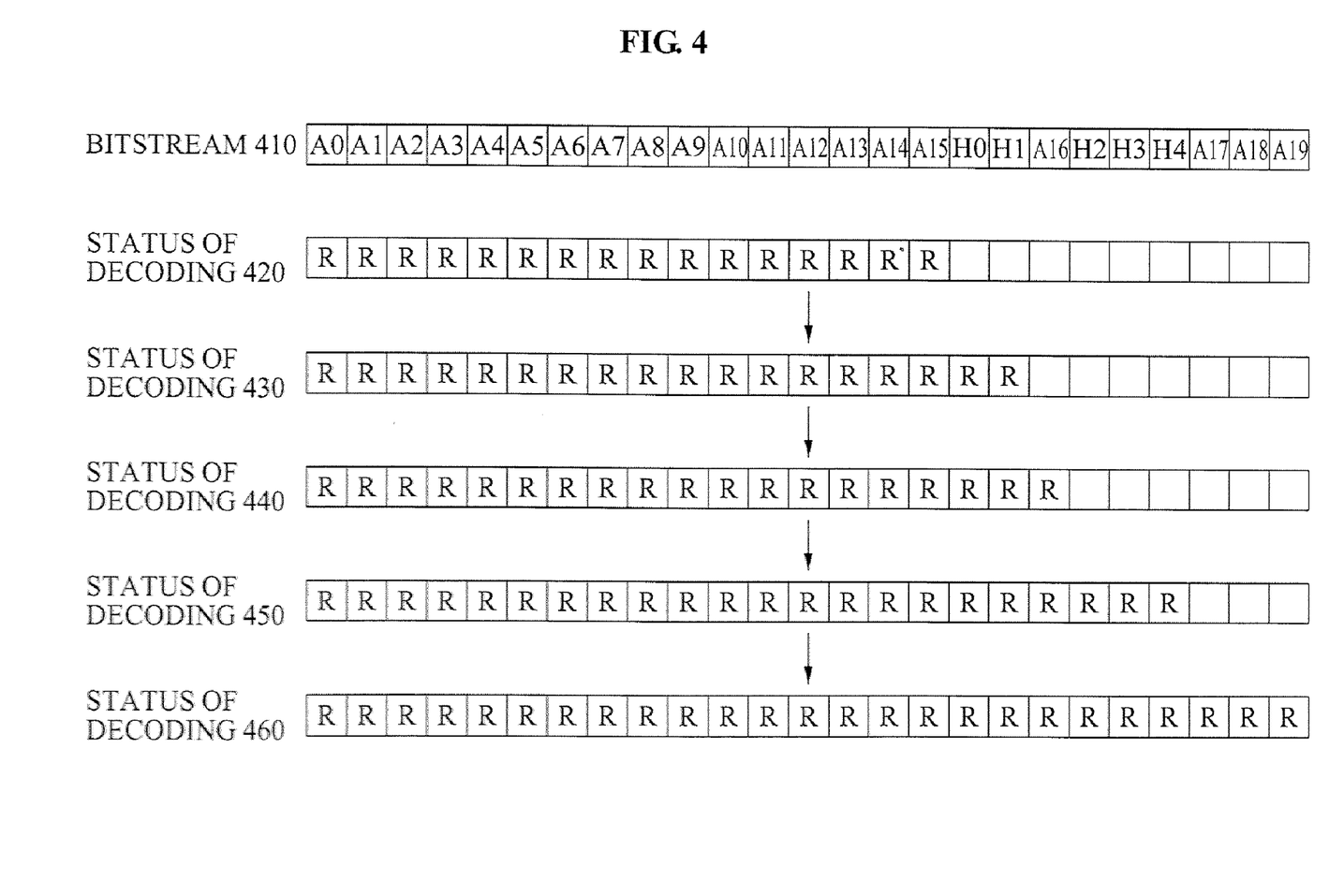
FIG. 4 is a diagram illustrating example operations to perform lossless decoding which can be carried out in an apparatus to perform lossless decoding.

FIG. 4 is a diagram illustrating example operations to perform lossless decoding which can be carried out in the apparatus 900 to perform lossless decoding.

The apparatus 900 to perform lossless decoding may receive sequential bitstreams 410.

As illustrated in FIG. 4, the status of decoding bitstreams 420 through 460 indicates the status of the sequential bitstream 410.

The status of decoding 420 indicates a status after 16 first bitstreams A0 through A15 are stored in the register. Bits represented as R indicate decoded bits.

Since the bitstreams 410 generated via the coding operations in FIG. 3 include 16 arithmetically coded bits A0 through A15, the apparatus 900 to perform lossless decoding may select a decoding scheme of a subsequent bit after storing the sixteen first bitstreams A0 through 15 in the register.

For example, the apparatus 900 to perform lossless decoding may extract contexts of bits H0 and H1 and may select the Huffman decoding scheme based on the contexts. The apparatus 900 to perform lossless decoding may perform the Huffman decoding with respect to H0 and H1 to generate a symbol. The status of decoding 430 can indicate a status after the Huffman decoding is performed with respect to the bits H0 and H1.

The apparatus 900 to perform lossless decoding may extract a context of a bit A16 and select an arithmetic decoding scheme based on the context. The apparatus 900 to perform lossless decoding may perform the arithmetic decoding based on the bitstreams A0 through A15 and the bit A16 stored in the register. The status of decoding 440 can indicate a status after the arithmetic decoding is performed with respect to the first bitstreams A0 through A15 and the bit A16. In this instance, the arithmetic decoding operation may affect the contents stored in the register.

The apparatus 900 to perform lossless decoding may extract contexts of bits H2, H3, and H4 and select the Huffman scheme based on the contexts. The apparatus 900 to perform lossless decoding may perform the Huffman scheme with respect to the bits H2, H3, and H4. The status of 450 can indicate a status after the Huffman decoding is performed with respect to the bits H2, H3, and H4.

The apparatus 900 to perform lossless decoding may extract contexts of bits A17, A18, A19 and select an arithmetic scheme based on the contexts. The apparatus 900 to perform lossless decoding may perform the arithmetic decoding based on the contexts stored in the register and the bits A17, A18, and A19. The status of 460 can indicate a status after the arithmetic decoding is performed with respect to the contents stored in the register and the bits A17, A18, and A19.

Figure 6:
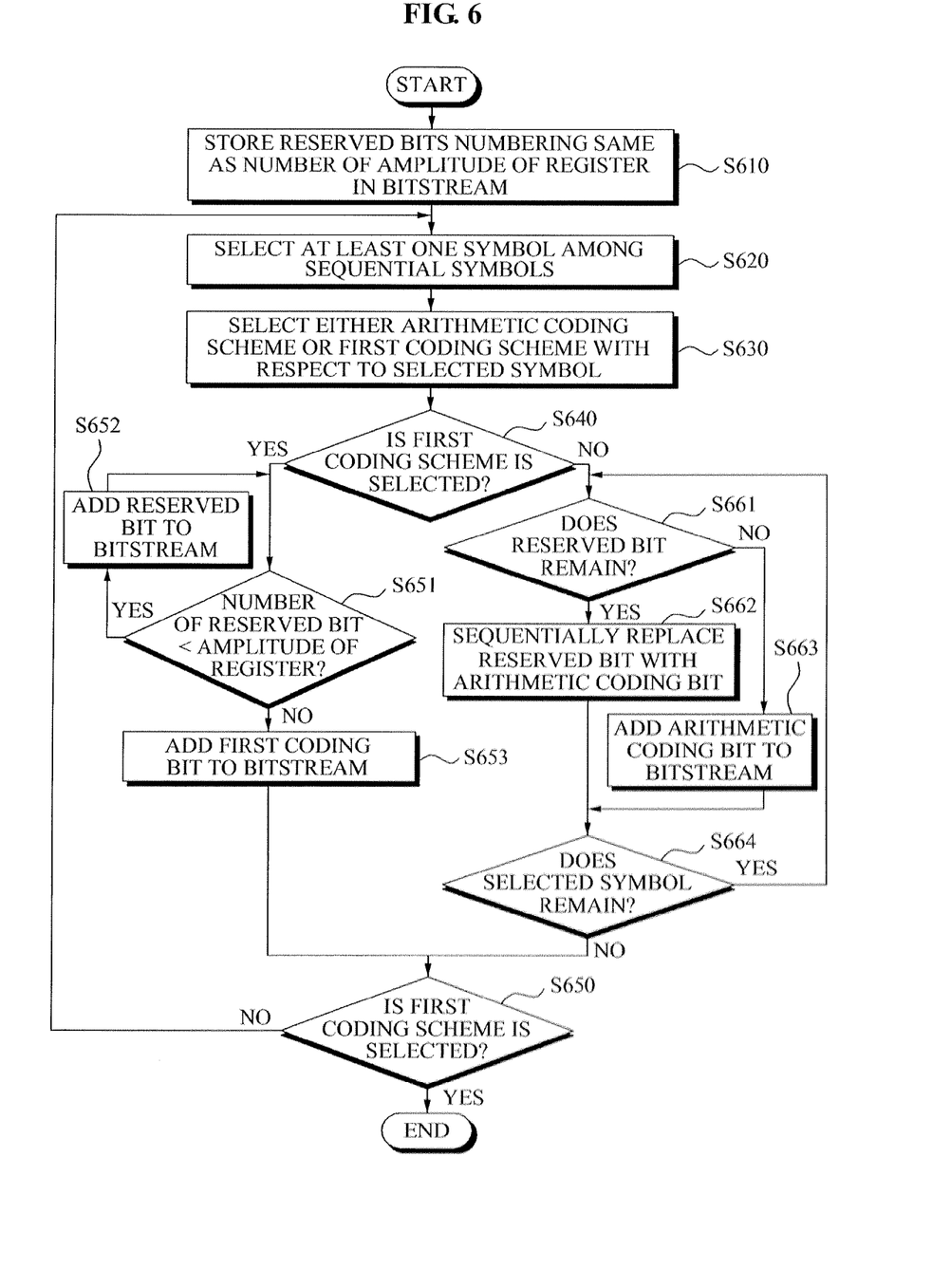
FIG. 6 is a flowchart illustrating a method of lossless coding according to an example embodiment.

FIG. 6 is a flowchart illustrating a method of lossless coding according to an example embodiment of the present general inventive concept.

Referring to FIG. 6, the method of lossless coding may store an M number of reserved bits in a bitstream in operation S610.

In operation S620, the method of lossless coding may select at least one symbol from sequential symbols.

In operation S630, the method of lossless coding may select either an arithmetic coding scheme or a first coding scheme with respect to the selected at least one symbol.

The method of lossless coding may determine whether the first coding scheme is selected in operation S640, and may determine whether a number of a reserved bit included in a bitstream is less than M when the first coding scheme is selected in operation S651. Here, M may be an amplitude of a predetermined area. As described above, M may be a minimum number of reserved bits so that the arithmetic coding scheme can be performed without a bitstream jump.

In operation S652, the method of lossless coding may add the reserved bit to the bitstream when the number of the reserved bit included in the bitstream is less than M.

The method of lossless coding may perform operation S651 again with respect to the bitstream where the reserved bit is added.

The method of lossless coding may add a first coding bit, generated according to the first coding scheme, to the bitstream when the number of reserved bits included in the bitstream is equal to M in operation S653.

When the first coding scheme is not selected, the method of lossless coding may determine whether a reserved bit remains in the bitstream in operation S661.

The method of lossless coding may sequentially replace the reserved bit with arithmetic coding bits generated according to an arithmetic coding scheme when the remaining reserved bits exist in operation S662.

In operation S663, the method of lossless coding may add the arithmetic coding bit to the bitstream when the remaining reserved bit does not exist.

In operation S664, the method of lossless coding may determine whether the selected symbol remains after operation S662 or operation S663 is performed.

The method of lossless coding may perform operation S661 again with respect to the remaining symbol and the bitstream when the selected symbol remains.

In operation S650, the method of lossless coding may determine whether all symbols are selected among the sequential symbols when the selected symbol does not exist. The method of lossless coding may determine whether all symbols are selected among the sequential symbols after adding the first coding bit to the bitstream in operation S650.

The method of lossless coding may perform operation S620 again with respect to the remained symbol when unselected symbols remain among the sequential symbols.

The method of lossless coding may end the sequence when all the sequential symbols are selected.

Figure 7:
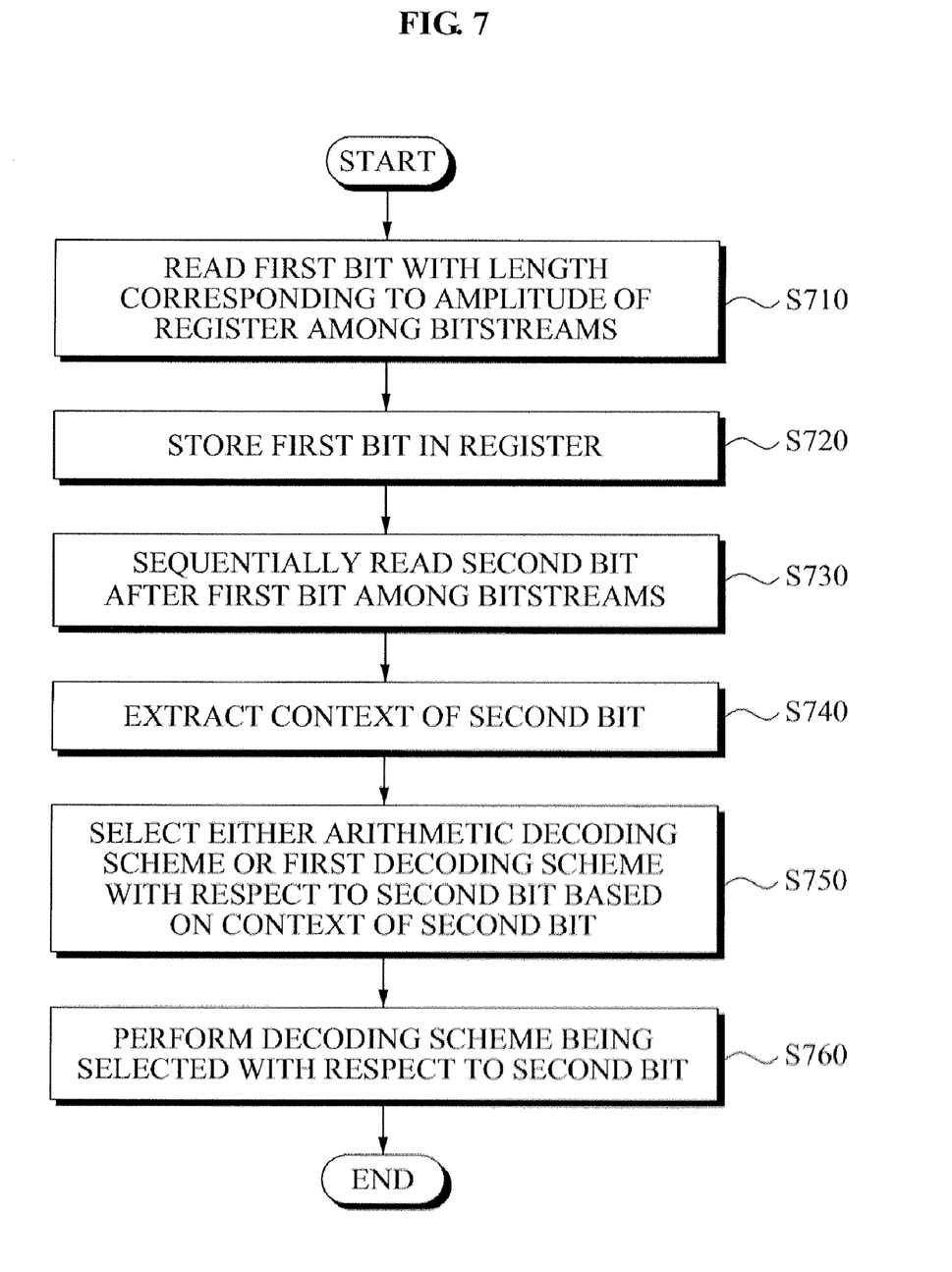
FIG. 7 is a flowchart illustrating a method of lossless decoding according to an example embodiment.

FIG. 7 is a flowchart illustrating a method of lossless decoding according to an example embodiment of the present general inventive concept.

Referring to FIG. 7, the method of lossless decoding may read a first bit having a length corresponding to an amplitude of a register among sequential bitstreams in operation S710.

In operation S720, the method of lossless decoding may store the first bit in the register.

In operation S730, the method of lossless decoding may sequentially read a second bit after the first bit among the sequential bitstreams.

In operation S740, the method of lossless decoding may extract a context of the second bit.

In operation S750, the method of lossless decoding may select either an arithmetic decoding scheme or a first decoding scheme with respect to the second bit based on the context of the second bit.

In operation S760, the method of lossless decoding may perform the decoding scheme selected with respect to the second bit.

Figure 10:
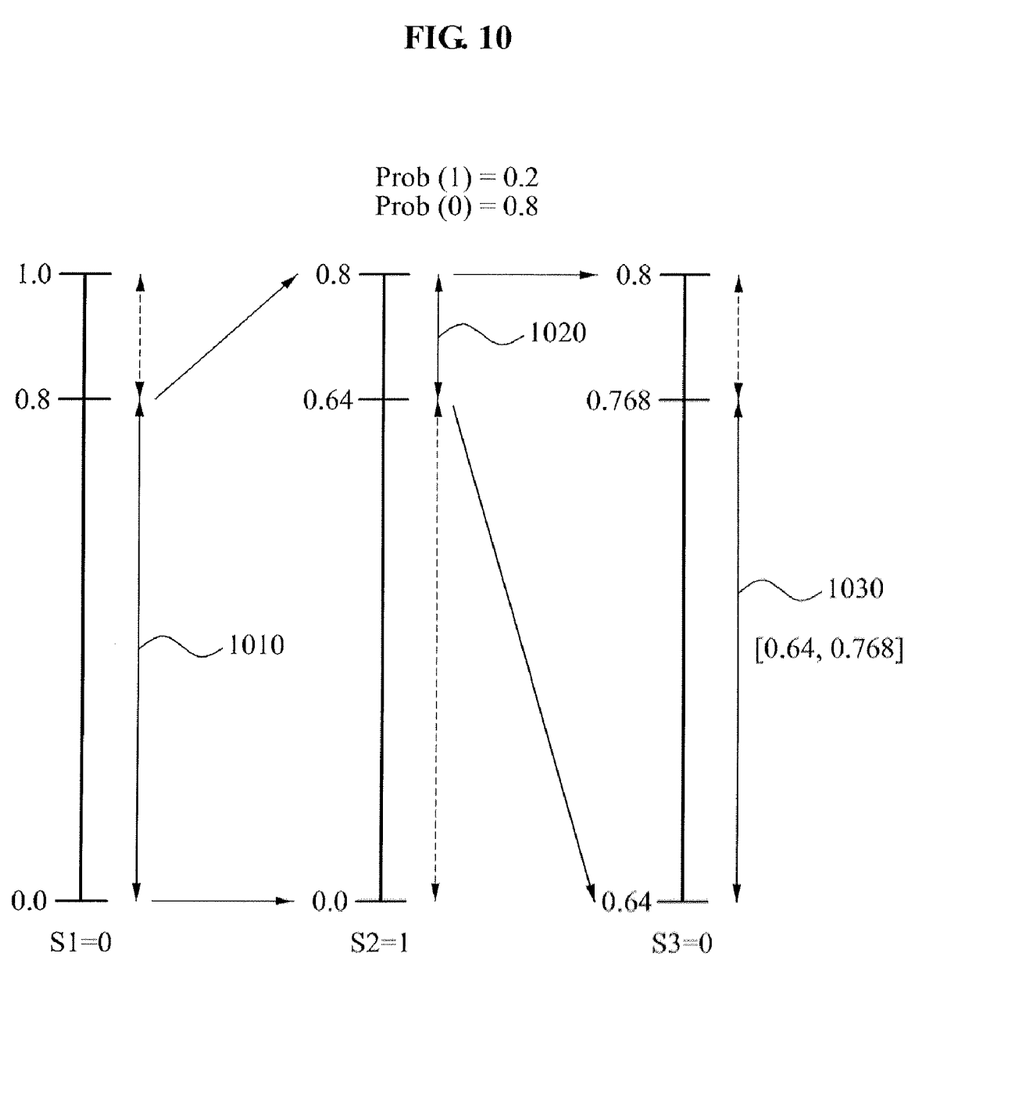
FIG. 10 is a diagram illustrating example operations of arithmetic coding which can be performed in the apparatus to perform lossless coding of FIG. 8.

FIG. 10 is a diagram illustrating example operations of arithmetic coding which can be performed in the apparatus 800 to perform lossless coding.

Referring to FIG. 10, performing an arithmetic coding with respect to three sequential symbols S1, S2, and S3 will be illustrated and described.

In this case, it will be assumed that a probability that an arbitrary symbol is 1 is 0.2, and a probability that the arbitrary symbol is 0 is 0.8.

As illustrated in FIG. 10, a probability duration [0, 1] may be divided into a probability duration [0.0, 0.8] 1010 that a symbol S1 is 0 and a probability duration [0.8, 1.0] that the symbol S1 is 1. Since the symbol S1 is 0, the apparatus 800 to perform lossless coding may select the probability duration 1010.

The probability duration 1010 may be divided into a probability duration [0.0, 0.64] that a symbol S2 is 0 and a probability duration [0.64, 0.80] 1020 that the symbol S2 is 1. Since the symbol S2 is 1, the apparatus 800 to perform lossless coding may select the probability duration 1020.

The probability duration 1020 may be divided into a probability duration [0.64, 0.768] 1030 that a symbol S3 is 0 and a probability duration [0.768, 0.80] that the symbol S3 is 1. Since the symbol S3 is 0, the apparatus 800 to perform lossless coding may select the probability duration 1030.

The apparatus 800 to perform lossless coding may select the probability duration 1030 with respect to the sequential symbols S1, S2, and S3 and generate a codeword corresponding to the probability duration 1030.

The apparatus 800 to perform lossless coding may select a codeword capable of representing the probability duration [0.64, 0.768] 1030 as a minimum number of bits. As an example, the apparatus 800 to perform lossless coding may select 11 as the codeword corresponding to the probability duration 1030 based on 0.11 (binary)=0.75 (decimal).

In this instance, since the three symbols S1, S2, and S3 may be represented as two bits, it may be understood that a 2/3 bit can be used per symbol.

Although FIG. 10 illustrates an example of binary arithmetic coding, it is understood that the present general inventive concept is not limited to the example of FIG. 10, and that other known or later developed coding techniques may be used without departing from the broader principles and spirit of the present general inventive concept.

The adaptive time/frequency-based encoding mode determination method according to the present general inventive concept may be embodied as a program instruction capable of being executed via various computer units and may be recorded in a computer readable recording medium. The computer readable medium may include a program instruction, a data file, and a data structure, separately or cooperatively. The program instructions and the media may be those specially designed and constructed for the purposes of the present general inventive concept, or they may be computer readable media such as magnetic media (e.g., hard disks, floppy disks, and magnetic tapes), optical media (e.g., CD-ROMs or DVDs), magneto-optical media (e.g., optical disks), and/or hardware devices (e.g., ROMs, RAMs, or flash memories, etc.) that are specially configured to store and perform program instructions. Examples of the program instructions may include machine code such as produced by a compiler, and/or files containing high-level language codes that may be executed by the computer with use of an interpreter. The hardware devices above may be configured to act as one or more software modules to implement operations of the general inventive concept, or vice versa.

The present general inventive concept can also be embodied as computer-readable codes on a computer-readable medium, and can be implemented as program code segments to perform operations necessary to the respective elements of the present general inventive concept. The computer-readable medium can include a computer-readable recording medium and a computer-readable transmission medium. The computer-readable recording medium can be any data storage device that can store data which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. Also, functional programs, codes, and code segments to accomplish the present general inventive concept can be easily construed by programmers skilled in the art to which the present general inventive concept pertains.

Although a few example embodiments of the present general inventive concept have been illustrated and described, it will be appreciated by those skilled in the art that changes may be made in these example embodiments without departing from the principles and spirit of the general inventive concept, the scope of which is defined in the appended claims and their equivalents.

What is claimed is:

1. An apparatus to perform lossless coding, wherein the apparatus generates a coded bitstream by selectively performing an arithmetic coding scheme or a first coding scheme with respect to a symbol,
    wherein the coded bitstream includes a first coding bit generated according to the first coding scheme and a reserved bit for the arithmetic coding scheme, when the first coding scheme is selected.

2. The apparatus of claim 1, wherein when the arithmetic coding scheme is selected, the apparatus sequentially replaces the reserved bit with arithmetic coding bits generated according to the arithmetic coding scheme.

3. The apparatus of claim 2, wherein when the arithmetic scheme is selected, the apparatus sequentially adds the arithmetic coding bits to the bitstream when a reserved bit does not exist.

4. The apparatus of claim 1, wherein the arithmetic coding scheme is performed using a register having an amplitude corresponding to a length of the reserved bit.

5. The apparatus of claim 1, wherein the arithmetic scheme or the first coding scheme is selected based on a context of the symbol.

6. The apparatus of claim 1, wherein the arithmetic scheme or the first coding scheme is selected based on an amplitude of another symbol previous to the symbol.

7. The apparatus of claim 1, wherein the first coding scheme is selected when the symbol has a probability distribution corresponding to $(½)^N$ (N: positive number).

8. The apparatus of claim 1, wherein the first coding scheme maps a single symbol on a single bit or on a plurality of bits.

9. The apparatus of claim 1, wherein the first coding scheme is the Huffman coding scheme.

10. An apparatus to perform lossless decoding, wherein the apparatus generates a symbol by selectively performing an arithmetic decoding scheme or a first decoding scheme with respect to a bitstream,
    wherein the bitstream includes a first coding bit generated according to a first coding scheme and a reserved bit for an arithmetic coding scheme, when the first coding scheme is selected.

11. The apparatus of claim 10, wherein the symbol is generated by reading a first bitstream of a first length among the bitstream and storing the read first bitstream in a register, sequentially reading a second bit after the first bitstream among the bitstream, and selectively performing the arithmetic decoding scheme or the first decoding scheme with respect to the second bit.

12. The apparatus of claim 11, wherein a context is generated using previously decoded symbols, and either the arithmetic decoding scheme or the first decoding scheme is selected with respect to the second bit based on the context.

13. The apparatus of claim 11, further performing the arithmetic decoding scheme using a bit stored in the register, when the arithmetic decoding scheme is selected.

14. The apparatus of claim 10, wherein the first decoding scheme is a decoding scheme where a single symbol is mapped on a single bit or a plurality of bits.

15. The apparatus of claim 10, wherein the first decoding scheme is the Huffman decoding scheme.

16. A method of lossless coding, the method comprising:
    selecting either an arithmetic coding scheme or a first coding scheme with respect to a symbol; and
    performing the selected coding scheme with respect to the symbol,
    wherein, when the first coding scheme is selected, the performing of the selected coding scheme generates a bitstream including a first coding bit according to the first coding scheme, and a reserved bit for the arithmetic coding scheme.

17. The method of claim 16, wherein, when the arithmetic coding scheme is selected, the generating of the selected coding scheme sequentially replaces arithmetic coding bits generated according to the arithmetic coding scheme.

18. The method of claim 17, wherein when the arithmetic scheme is selected, the performing of the selected coding scheme sequentially adds the arithmetic coding bits to the bitstream when a reserved bit does not exist.

19. The method of claim 16, wherein the selecting of either the arithmetic coding scheme or the first coding scheme selects any one of the arithmetic coding scheme or the first coding scheme based on the context of the symbol.

20. A method of lossless decoding, the method comprising:
    selecting either an arithmetic decoding scheme or a first decoding scheme with respect to a bitstream; and
    performing the selected decoding scheme with respect to the bitstream,
    wherein the bitstream includes a first coding bit generated according to a first coding scheme and a reserved bit for an arithmetic coding scheme, when the first coding scheme is selected.

21. The method of claim 20, wherein the selecting comprises reading a first bitstream of a first length among the bitstream;
    storing the read first bitstream in a register;
    reading a second bit after the first bitstream among the bitstream; and
    selecting either the arithmetic decoding scheme or the first decoding scheme with respect to the second bit,
    wherein the performing-comprises generating a symbol by performing the selected decoding scheme that is selected with respect to the second bit.

22. A computer-readable recording medium having embodied thereon computer readable codes to execute a method of lossless coding, the method comprising:
  selecting either an arithmetic coding scheme or a first coding scheme with respect to a symbol; and
  performing the selected coding scheme with respect to the symbol,
  wherein, when the first coding scheme is selected, the performing of the selected coding scheme generates a bitstream including a first coding bit according to the first coding scheme, and a reserved bit for the arithmetic coding scheme.

23. A lossless coding method to generate a coded bitstream corresponding to an analog signal, comprising:
  converting the analog signal into a digital signal including a plurality of symbols;
  determining at least one spectral component of the analog signal based on at least one symbol among the plurality of symbols; and
  selectively performing one of a first coding scheme or an arithmetic coding scheme on the at least one symbol based on the determined at least one spectral component to generate at least one coded bitstream.

* * * * *